United States Patent
Du et al.

(10) Patent No.: US 8,020,609 B2
(45) Date of Patent: Sep. 20, 2011

(54) HEAT SINK ASSEMBLY HAVING A CLIP

(75) Inventors: Juan Du, Shenzhen (CN); Cui-Jun Lu, Shenzhen (CN)

(73) Assignees: Fu Zhun Precision Industry ( Shen Zhen) Co., Ltd., Shenzhen, Guangdong Province (CN); Foxconn Technology, Tu-Cheng, New Taipei (TW)

( * ) Notice: Subject to any disclaimer, the term of this patent is extended or adjusted under 35 U.S.C. 154(b) by 645 days.

(21) Appl. No.: 12/143,850

(22) Filed: Jun. 23, 2008

(65) Prior Publication Data

US 2009/0316367 A1 Dec. 24, 2009

(51) Int. Cl.
*F28F 7/00* (2006.01)
*F28F 9/00* (2006.01)

(52) U.S. Cl. .......................... 165/80.3; 165/67; 257/718

(58) Field of Classification Search .................. 165/80.3, 165/185, 67, 76; 361/704, 718, 719, 697, 361/709; 24/455; 257/718, 719
See application file for complete search history.

(56) References Cited

U.S. PATENT DOCUMENTS

| | | | | |
|---|---|---|---|---|
| 5,428,897 A | * | 7/1995 | Jordan et al. | 29/890.03 |
| 6,644,387 B1 | * | 11/2003 | Lee et al. | 165/80.3 |
| 6,768,641 B2 | * | 7/2004 | Li | 361/719 |
| 6,803,652 B2 | * | 10/2004 | Winkel et al. | 257/706 |
| 7,385,822 B1 | * | 6/2008 | Li et al. | 361/709 |
| 2003/0015343 A1 | * | 1/2003 | Chen | 174/252 |
| 2003/0214787 A1 | | 11/2003 | Liu | |
| 2006/0012960 A1 | * | 1/2006 | Hsieh et al. | 361/703 |
| 2007/0044282 A1 | * | 3/2007 | Li et al. | 24/455 |
| 2007/0206359 A1 | | 9/2007 | Lai et al. | |

FOREIGN PATENT DOCUMENTS

| | | |
|---|---|---|
| CN | 2551959 Y | 5/2003 |
| TW | 520133 | 2/2003 |

* cited by examiner

*Primary Examiner* — Tho V Duong
(74) *Attorney, Agent, or Firm* — Altis Law Group, Inc.

(57) ABSTRACT

A heat sink assembly includes a heat sink and a clip. The clip includes a main body, two pressing portions extending outwardly from two opposite ends of the main body, two extension portions each extending upwardly from an outer end of a corresponding pressing portion, a locking arm extending slantwise and upwardly from an upper end of each extension portion, a U-shaped operating portion extending from a far end of the locking arm and a J-shaped hook extending from a free end of the operating portion. The operating portion is provided for receiving a depressing force acting on the clip for moving the hook to engage with a clasp on a printed circuit board.

13 Claims, 4 Drawing Sheets

HEAT SINK ASSEMBLY HAVING A CLIP

BACKGROUND OF THE INVENTION

1. Field of the Invention

The present invention relates to a heat sink assembly, and more particularly to a heat sink assembly having a heat sink and a clip which can easily secure the heat sink on an electronic device, wherein the clip has an improved structure, thereby satisfying a labor-saved requirement when the clip is manipulated to firmly secure the heat sink to the electronic device.

2. Related Art

Advances in microelectronics technology have resulted in electronic devices which process signals and data at unprecedented high speeds. During operation of many contemporary electronic devices such as central processing units (CPUs), solid-state circuits, and light emitting diode (LED) display units, large amounts of heat are produced. This heat must be efficiently removed to prevent the electronic devices from becoming unstable or being damaged.

Typically, a heat sink assembly is used to cool the electronic device. The heat sink assembly comprises a heat sink attached to an outer surface of the electronic device to facilitate removal of heat therefrom and a clip for fastening the heat sink to the electronic device. The heat sink includes a base and a plurality of fins extending from the base. A channel is defined between every two adjacent fins. The clip extends through one of the channels and abuts against a top surface of the base, with two ends thereof locked on a printed circuit board on which the electronic device is mounted to provide pressure for securing the heat sink on the electronic device.

In the heat sink assembly mentioned above, usually, the clip is a wire clip which is integrally made of a resilient metal wire. However, this kind of the clip with a linear structure often only provides a very limited contacting area for an assembler to apply a force on the clip, in order to secure the clip to a printed circuit board so that the heat sink can depress a heat-generating electronic component on the printed circuit board. After a period of assembling, fingers of the assembler may become sore, resulting in that the assembler can no longer effectively proceed his (her) assembling work. To provide such a clip with a protective cover for facilitating the assembler to apply the force nevertheless increases the cost of the clip. Furthermore, for such a conventional linear clip, it requires a long length in order to provide the required spring force. An elongated clip is not favorable in view of layout of electronic components on the printed circuit board, since the clip has a significant portion extending out of the heat sink to a position over the printed circuit board.

What is needed, therefore, is a heat sink assembly having a heat sink and a clip securing the heat sink to an electronic device, wherein the clip has an improved structure so that the clip can be easily manipulated to secure the heat sink to the electronic device.

SUMMARY OF THE INVENTION

A heat sink assembly includes a heat sink and a clip. The heat sink includes a base and a plurality of fins extending upwardly from a top surface of the base. The clip includes a main body, two pressing portions extending from two opposite ends of the main body, two locking arms extending from two ends of two vertical extension portions extending from the pressing portions, and two operating portions formed at two ends of the locking arms. Each operating portion has a bent, U-shaped structure to provide a large contacting area for receiving a mounting force acting on the clip. The main body and the pressing portions of the clip are received in a groove between two neighboring ones of the fins and the pressing portions abut against the top surface of the base. The locking arms of the clip are located adjacent and parallel to two opposite sides of the heat sink and above the base of the heat sink. When the force is applied to the operating portions of the clip which has the large contacting area for receiving the force, J-shaped hooks extending from free ends of the operating portions are lowered to engage with clasps on a printed circuit board, whereby the heat sink is depressed by the clip to have an intimate contact with a heat-generating electronic component on the printed circuit board.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
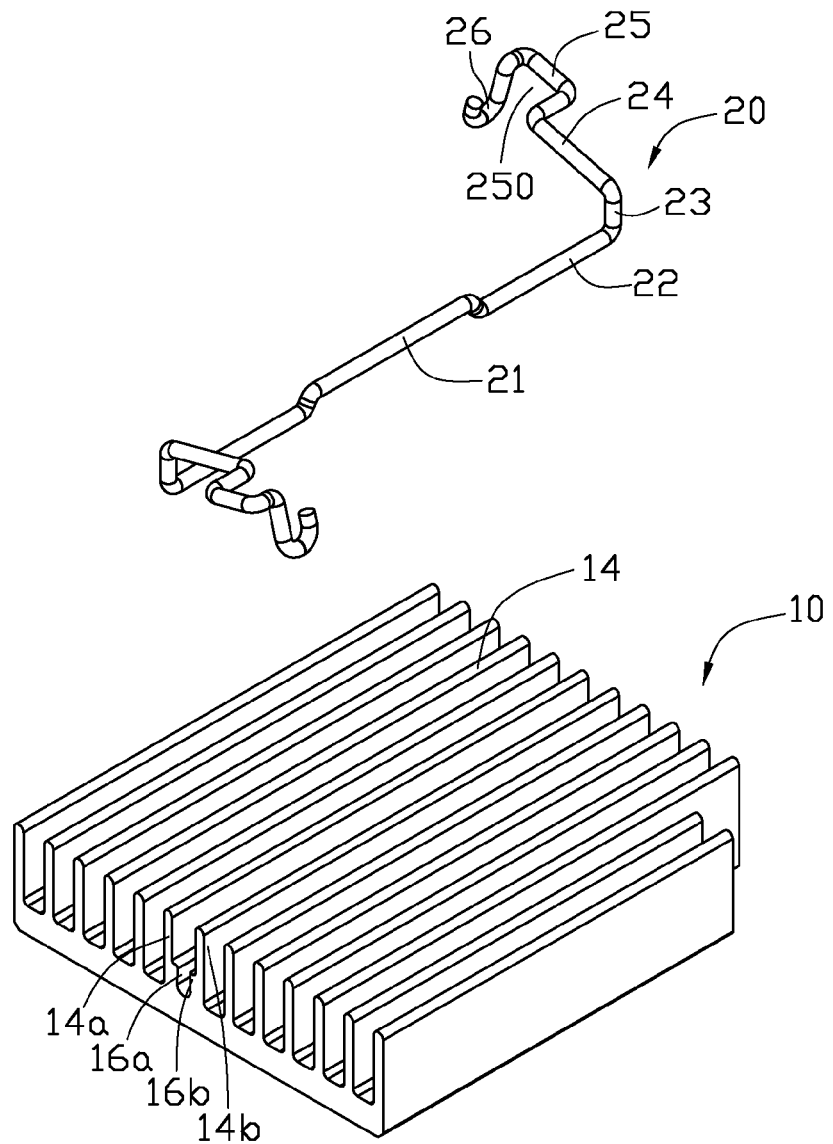
FIG. 1 is an isometric, exploded view of a heat sink assembly in accordance with a preferred embodiment of the present invention.
Figure 2:
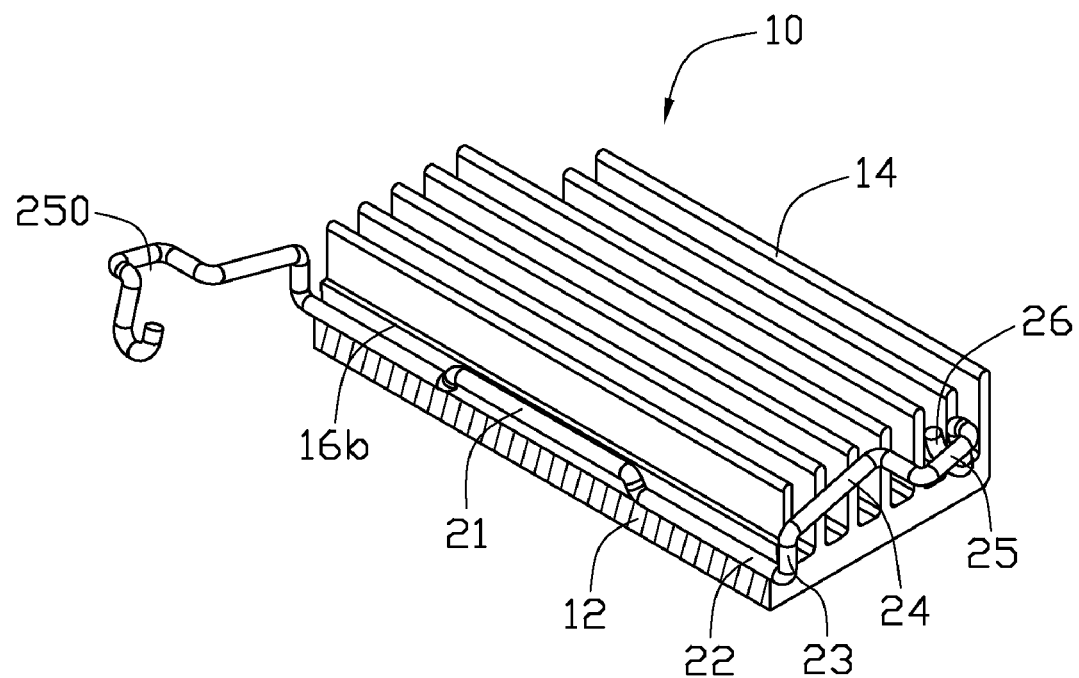
FIG. 2 is an isometric, assembled view of the heat sink assembly of FIG. 1, wherein a part of a heat sink of the heat sink assembly is removed.
Figure 3:
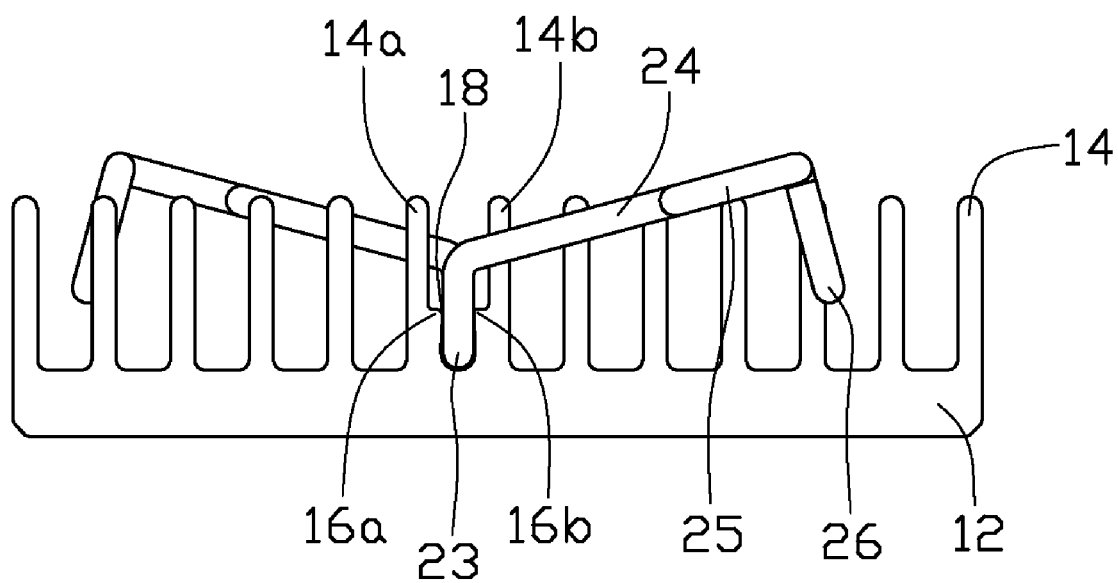
FIG. 3 is a side elevational view of the heat sink assembly of FIG. 1.
Figure 4:
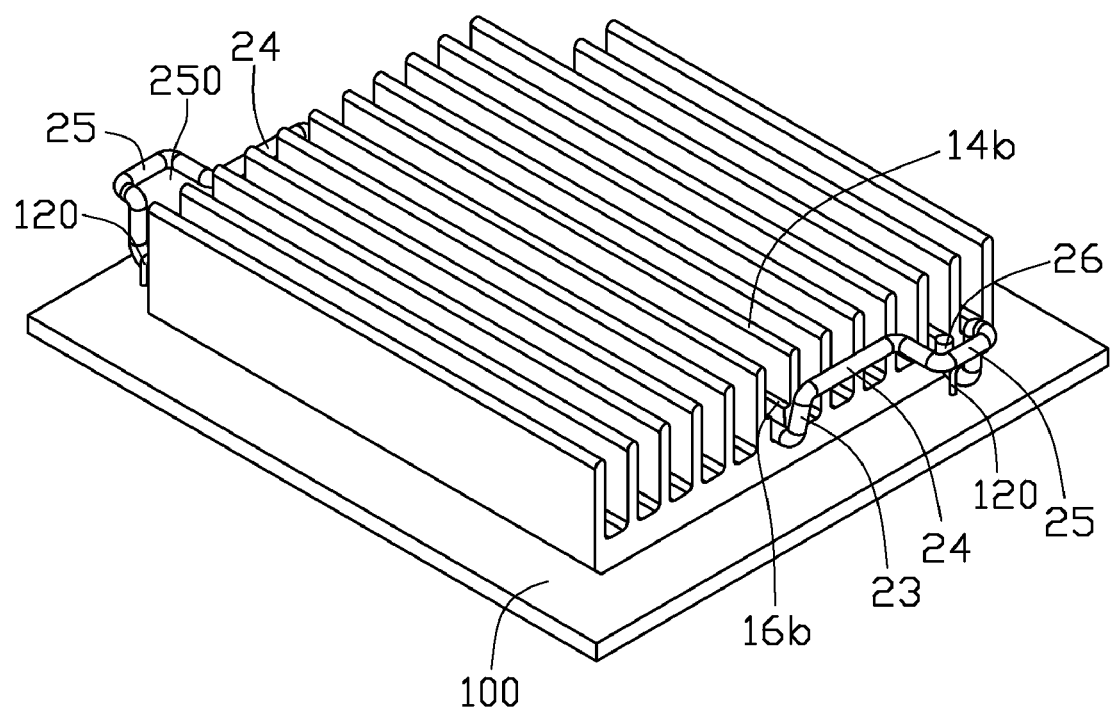
FIG. 4 is a perspective view of the heat sink assembly of FIG. 1 mounted on a printed circuit board.

Referring to FIGS. 1-4, a heat sink assembly, which is used for dissipating heat generated from an electronic element (not shown) on a printed circuit board 100, comprises a heat sink 10 and a clip 20. The clip 20 is used to secure the heat sink 10 onto the printed circuit board 100 whereby the heat sink 10 can have an intimate contact with the electronic element.

The heat sink 10 is integrally made of metal with a high heat conductivity such as copper, aluminum or an alloy thereof. The heat sink 10 comprises a rectangular base 12 and a plurality of fins 14 extending upwardly from a top surface of the base 12. The fins 14 are parallel to each other. A channel (not labeled) is defined between every two adjacent fins 14. Two protrusions 16a, 16b facing towards each other are formed at lower portions of two adjacent fins 14a, 14b which are located at a center of the heat sink 10. The protrusions 16a, 16b at the center of the heat sink 10 define a straight groove 18 therebetween, for receiving the clip 20 therein. A width of the groove 18 is smaller than a gap between the fins 14a, 14b. Strength of the lower portions of the fins 14a, 14b is reinforced by the protrusions 16a, 16b. Furthermore, the protrusions 16a, 16b provide a close engagement between the heat sink 10 and the clip 20.

The clip 20 is a wire clip which is integrally made of a resilient metal wire. The clip 20 comprises a main body 21 and a pair of pressing portions 22 extending downwardly from two opposite ends of the main body 21 along opposite directions, two extension portions 23 extending upwardly from two outer ends of the pressing portions 22, respectively, two locking arms 24 extending oppositely from two upper ends of the extension portions 23, respectively, and two operating portions 25 extending oppositely from two far ends of the locking arms 24, respectively. The locking arms 24 are oriented perpendicular to the main body 21 and the pressing portions 22. Each operating portion 25 has a generally U-shaped configuration and is generally horizontally oriented. A j-shaped hook 26 is formed on a free end of each of the operating portions 25. The hook 26 extends downwards from the free end of the operating portion 25.

The main body 21 is located above the pressing portions 22 for engaging with the protrusions 16a, 16b of the heat sink 10 to prevent a free movement of the clip 20 in the groove 18 of the heat sink 10. The main body 21 and pressing portions 22 cooperatively have a length slightly larger than a width of the base 12 of the heat sink 10 (clearly seen from FIG. 2) and a length of the groove 18. The pressing portions 22 extend horizontally from the two opposite ends of the main body 21. The pressing portions 22 each are parallel to the main body 21, and are symmetric to the main body 21. The pressing portions 22 are at a level lower than that of the main body 21. The two extension portions 23 each extend upwardly from the outer end of a corresponding pressing portion 22 and are symmetric to the main body 21. The extension portions 23 each have a height larger than that of the base 12 of the heat sink 10 and smaller than that of the fins 14 of the heat sink 10, whereby the locking arms 24 and operating portions 25 are located above the base 12 of the heat sink 10 a sufficient distance. Thus, the locking arms 24 and the operating portions 25 can be prevented from interfering with electronic elements located adjacent to front and rear sides of the base 12 of the heat sink 10 when the locking arms 24 and the operating portions 25 are manipulated to move downwardly to cause the hooks 26 to connect with the printed circuit board 100.

The locking arms 24 extend slantwise, upwardly from the two upper ends of the extension portions 23 along opposite directions, respectively, and inclined to the base 12 of the heat sink 10. The operating portions 25 are extended from the far ends of the locking arms 24, respectively. Each operating portion 25 extends outwardly, then laterally and finally inwardly for have the U-shaped configuration. The U-shaped operating portion 25 lies on a generally horizontal plane. The operating portion 25 surrounds a space 250 opening inwards. Each operating portion 25 has a function like a handle for an assembler to manipulate the clip 20 in order to fasten the heat sink 10 to the printed circuit board 100. The J-shaped hooks 26 extend downwardly from the free ends of the operating portions 25, respectively. The hooks 26 are used to lock with clasps 120 attached on a top surface of the printed circuit board 100 and located near diagonal corners of the heat sink 10 to firmly secure the heat sink 10 onto the printed circuit board 100.

In assembly, the main body 21 and the pressing portions 22 of the clip 20 extend between the fins 14a, 14b and are fitly received in the groove 18 of the heat sink 10, with the locking arms 24 being located adjacent and parallel to opposite front and rear sides of the heat sink 10. The operating portions 25 are also located near the front and rear sides of the heat sink 10, with the openings 250 of the operating portions 25 facing the fins 14 of the heat sink 10. Then, a force is applied to act on the operating portions 25 to press downwardly the locking arms 24 towards the base 12 of the heat sink 10 until the hooks 26 are locked with the clasps 120 on the printed circuit board 100 to firmly secure the heat sink 10 to the printed circuit board 100. As the operating portions 25 each have a U-shaped structure, a large contacting area is available for receiving the depressing force applied to the operating portions 25. Thus, an assembler can more easily manipulate the clip 20 to cause the clip 20 to firmly secure the heat sink 10 to the printed circuit board 100 with a less stress reacting against the assembler's fingers, and the assembler accordingly can no longer have sore fingers even after a long period of assembling work.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly, comprising:
   a heat sink comprising a base and a plurality of fins extending from a top surface of the base; and
   a clip comprising:
   a pair of pressing portions abutting against the top surface of the base;
   a pair of extension portions extending upwardly from outer ends of the pressing portions;
   two locking arms extending upwardly from upper ends of the extension portions respectively, and located adjacent and parallel to two opposite sides of the heat sink, the locking arms being perpendicular to the pressing portions;
   two U-shaped operating portions extending from two ends of the locking arms, each operating portion extending on a horizontal plane; and
   two hooks each extending from a free end of a corresponding operating portion;
   wherein the hooks are adapted for fastening with a printed circuit board, and wherein the operating portions are used to receive a depressing force for moving the hooks downwardly to fasten with the printed circuit board.

2. The heat sink assembly as claimed in claim 1, wherein each of the hooks has a J-shaped configuration.

3. The heat sink assembly as claimed in claim 1, wherein the clip further comprises a main body located between the two pressing portions and the main body is located above the pressing portions.

4. The heat sink assembly as claimed in claim 3, wherein each hook extends downwardly from the free end of the corresponding operating portion.

5. The heat sink assembly as claimed in claim 4, wherein the fins of the heat sink are parallel to each other, and two protrusions are formed at lower portions of two adjacent middle fins, a groove being defined between the two protrusions for receiving the main body and the pressing portions of the clip.

6. The heat sink assembly as claimed in claim 4, wherein the extension portions extend upwardly from the pressing portions a distance so that the locking arms are located above the base of the heat sink.

7. A heat sink assembly comprising:
   a heat sink having a base and a plurality of fins extending upwardly from the base;
   a clip having a main body received in a channel between two adjacent fins, a pair of pressing portions extending from two opposite ends of the main body and abutting against the base, a pair of extension portions extending upwardly from outer ends of the pressing portions, a pair of locking arms each extending from an upper end of a corresponding extension portion, the locking arms being adjacent and parallel to two opposite sides of the heat sink, an operating portion extending from a far end of a corresponding locking arm, and a hook extending from a free end of the operating portion, the hook being adapted for fastening with a printed circuit board, wherein the operating portion has a curved configuration and extends on a horizontal plane, and is used for receiving a depressing force acting on the clip for causing the hook to move downwardly to fasten with the printed circuit board.

8. The heat sink assembly as described in claim 7, wherein the heat sink has two protrusions extending inwardly from lower portions of the two adjacent fins toward each other, the pressing portions of the clip being received between the protrusions.

9. The heat sink assembly as described in claim 7, wherein the two extension portions extend upwardly from the pressing portions a distance which is larger than a thickness of the base.

10. The heat sink assembly as described in claim 7, wherein the pair of locking arms each extend upwardly and slantwise from the upper end of the corresponding extension portion.

11. The heat sink assembly as described in claim 7, wherein the operating portion has a U-shaped configuration.

12. The heat sink assembly as described in claim 11, wherein the hook has a J-shaped configuration and extends downwardly from the operating portion.

13. The heat sink assembly as described in claim 11, wherein the operating portion surrounds a space opening toward the heat sink.

\* \* \* \* \*